(12) United States Patent
Wu et al.

(10) Patent No.: US 12,543,265 B2
(45) Date of Patent: Feb. 3, 2026

(54) SEMICONDUCTOR PACKAGE AND CHIP THEREOF

(71) Applicant: CHIPBOND TECHNOLOGY CORPORATION, Hsinchu (TW)

(72) Inventors: Wei-Hsin Wu, Hsinchu County (TW); Ku-Pang Chang, Hsinchu (TW); Chun-Chia Yeh, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 377 days.

(21) Appl. No.: 18/383,512

(22) Filed: Oct. 25, 2023

(65) Prior Publication Data

US 2024/0347493 A1 Oct. 17, 2024

(30) Foreign Application Priority Data

Apr. 12, 2023 (TW) ................. 112113563

(51) Int. Cl.
*H01L 23/00* (2006.01)
*H01L 23/498* (2006.01)
*H05K 1/11* (2006.01)

(52) U.S. Cl.
CPC ........ *H01L 24/16* (2013.01); *H01L 23/49838* (2013.01); *H01L 24/08* (2013.01);
(Continued)

(58) Field of Classification Search
CPC ... H01L 2224/0801; H01L 2224/08225; H01L 2224/16012; H01L 2224/16225; H01L 2924/3511; H01L 2924/384; H01L 24/13; H01L 24/14; H01L 24/17; H01L 24/81; H01L 23/49811; H01L 2224/1703; H01L 23/4985; H01L 2224/1412;
(Continued)

(56) References Cited

U.S. PATENT DOCUMENTS

2017/0246699 A1 8/2017 Song et al.
2020/0084888 A1 3/2020 Lee et al.
(Continued)

FOREIGN PATENT DOCUMENTS

JP 7-235564 A 9/1995
JP 2005-72212 A 3/2005
(Continued)

OTHER PUBLICATIONS

Japanese office action mailed Sep. 18, 2024 for Japanese patent application No. 2023-183387, 3 pages.
(Continued)

*Primary Examiner* — Victor A Mandala
(74) *Attorney, Agent, or Firm* — Demian K. Jackson; Jackson IPG PLLC

(57) ABSTRACT

A semiconductor package includes a flexible circuit board and a chip which includes a first bump group and a second bump group. First bumps of the first bump group and second bumps of the second bump group are provided to be bonded to leads on the flexible circuit board. The second bumps are designed to be longer than the first bumps in length so as to increase bonding strength of the second bumps to the leads, prevent the leads from being shifted and separated from the first and second bumps and prevent lead bonding misalignment.

19 Claims, 3 Drawing Sheets

(52) U.S. Cl.
CPC ...... *H05K 1/118* (2013.01); *H01L 2224/0801* (2013.01); *H01L 2224/08225* (2013.01); *H01L 2224/16012* (2013.01); *H01L 2224/16225* (2013.01); *H01L 2924/3511* (2013.01); *H01L 2924/384* (2013.01)

(58) Field of Classification Search
CPC ... H01L 2224/1605; H01L 2224/16057; H01L 24/16; H01L 23/49838; H01L 24/08; H05K 1/189; H05K 1/118
See application file for complete search history.

(56) References Cited

U.S. PATENT DOCUMENTS

| | | | |
|---|---|---|---|
| 2020/0375028 A1* | 11/2020 | Lee | H05K 1/115 |
| 2021/0202422 A1* | 7/2021 | Ma | H01L 23/49816 |
| 2021/0265255 A1* | 8/2021 | Ma | H01L 24/17 |
| 2022/0148976 A1 | 5/2022 | Lim et al. | |
| 2022/0367328 A1 | 11/2022 | Yu et al. | |
| 2023/0037785 A1* | 2/2023 | Lee | H01L 24/73 |
| 2023/0044345 A1* | 2/2023 | Ma | H01L 23/49811 |
| 2024/0347493 A1* | 10/2024 | Wu | H01L 24/81 |

FOREIGN PATENT DOCUMENTS

| | | |
|---|---|---|
| JP | 2010-199191 A | 9/2010 |
| JP | 2014-179364 A | 9/2014 |
| JP | 2020-537342 A | 12/2020 |
| JP | 3242376 U | 6/2023 |
| KR | 10-2010-0055193 A | 5/2010 |
| KR | 10-2021-0109427 A | 9/2021 |
| TW | 200837912 A | 9/2008 |
| TW | 201411751 A | 3/2014 |
| TW | 201436138 A | 9/2014 |
| TW | 201537700 A | 10/2015 |
| TW | 201611231 A | 3/2016 |
| TW | 201944564 A | 11/2019 |
| TW | 202042355 A | 11/2020 |
| TW | 202249227 A | 12/2022 |
| TW | 202314986 A | 4/2023 |

OTHER PUBLICATIONS

Taiwanese Office Action mailed Jan. 16, 2024 for Taiwanese Patent Application No. 112113563, 5 pages.
Japanese notice of allowance mailed Dec. 6, 2024 for Japanese patent application No. 2023-183387, 3 pages.
Korean office action mailed Dec. 17, 2024 for Korean patent application No. 10-2023-0143814, 12 pages.
Taiwanese Office Action mailed Jun. 5, 2024 for Taiwanese Patent Application No. 113110415, 7 pages.

* cited by examiner

SEMICONDUCTOR PACKAGE AND CHIP THEREOF

FIELD OF THE INVENTION

This invention relates to a semiconductor package, and more particularly to a semiconductor package able to prevent leads from being shifted or misaligned to bumps.

BACKGROUND OF THE INVENTION

Conventionally, bumps on a chip are bonded to leads on a substrate in thermal compression bonding process to allow the chip to be electrically connected to the substrate. Because of miniaturization trend, bump pitch may be reduced, or bumps may be arranged with multiple rows on the chip to be electrically connected to the substrate. However, distortion or warpage of the substrate may occur caused by process temperature variation, and the leads may be shifted while the bumps are bonded to the leads. For example, the leads provided to be bonded to the middle bumps or the bumps close to chip short side may be shifted and separated from the bumps easily following the possibility of lead bonding misalignment.

SUMMARY

One object of the present invention is to provide a semiconductor package and its chip. Because of bumps with different lengths, bonding strength of bumps to leads can be increased to prevent the leads bonded to the bumps from being shifted to cause lead separation or lead bonding misalignment.

A semiconductor package of the present invention includes a flexible circuit board and a chip. First circuit lines and second circuit lines are arranged on the flexible circuit board, and there is at least one second circuit line located between the two adjacent first circuit lines. First leads of the first circuit lines and second leads of the second circuit lines are located on a chip-mounting area defined on the flexible circuit board. The chip includes a first bump group and a second bump group. A first area and a second area are defined on a surface of the chip in a first direction, the first bump group including first inner bumps and first outer bumps is located on the first area, and the second bump group including second inner bumps and second outer bumps is located on the second area. In a second direction intersecting the first direction, the first outer bumps are closer to a long side of the surface than the first inner bumps, and the second outer bumps are closer to the long side than the second inner bumps. In the second direction, a third length of each of the second inner bumps is greater than a first length of each of the first inner bumps, and a fourth length of each of the second outer bumps is greater than a second length of each of the first outer bumps. Each of the first and second inner bumps are provided to be bonded to one of the first leads, and each of the first and second outer bumps are provided to be bonded to one of the second leads. A bonding area between each of the second inner bumps and the corresponding first leads is larger than that between each of the first inner bumps and the corresponding first leads, and a bonding area between each of the second outer bumps and the corresponding second leads is larger than that between each of the first outer bumps and the corresponding second leads.

A chip of a semiconductor package of the present invention includes a first bump group and a second bump group. A first area and a second area are defined on a surface of the chip in a first direction. The first bump group including first inner bumps and first outer bumps is disposed on the first area, and the second bump group including second inner bumps and second outer bumps is disposed on the second area. In a second direction intersecting the first direction, the first outer bumps are closer to a long side of the surface than the first inner bumps, and the second outer bumps are closer to the long side than the second inner bumps. In the second direction, a third length of each of the second inner bumps is greater than a first length of each of the first inner bumps, and a fourth length of each of the second outer bumps is greater than a second length of each of the first outer bumps.

Another chip of a semiconductor package of the present invention includes first bumps and second bumps. A first area and a second are defined on a surface of the chip in a first direction. The first bumps are arranged on the first area, and the second bumps are arranged on the second area. In a second direction intersecting the first direction, a length of each of the second bumps is greater than that of each of the first bumps.

In the present invention, the bumps of the second bump group are designed to be longer than the bumps of the first bump group to increase bonding strength of the bumps of the second bump group to the corresponding leads. Thus, it is feasible to prevent the leads bonded to the bumps of the second bump group from being shifted to cause lead separation or lead bonding misalignment.

DETAILED DESCRIPTION OF THE INVENTION

Figure 1:
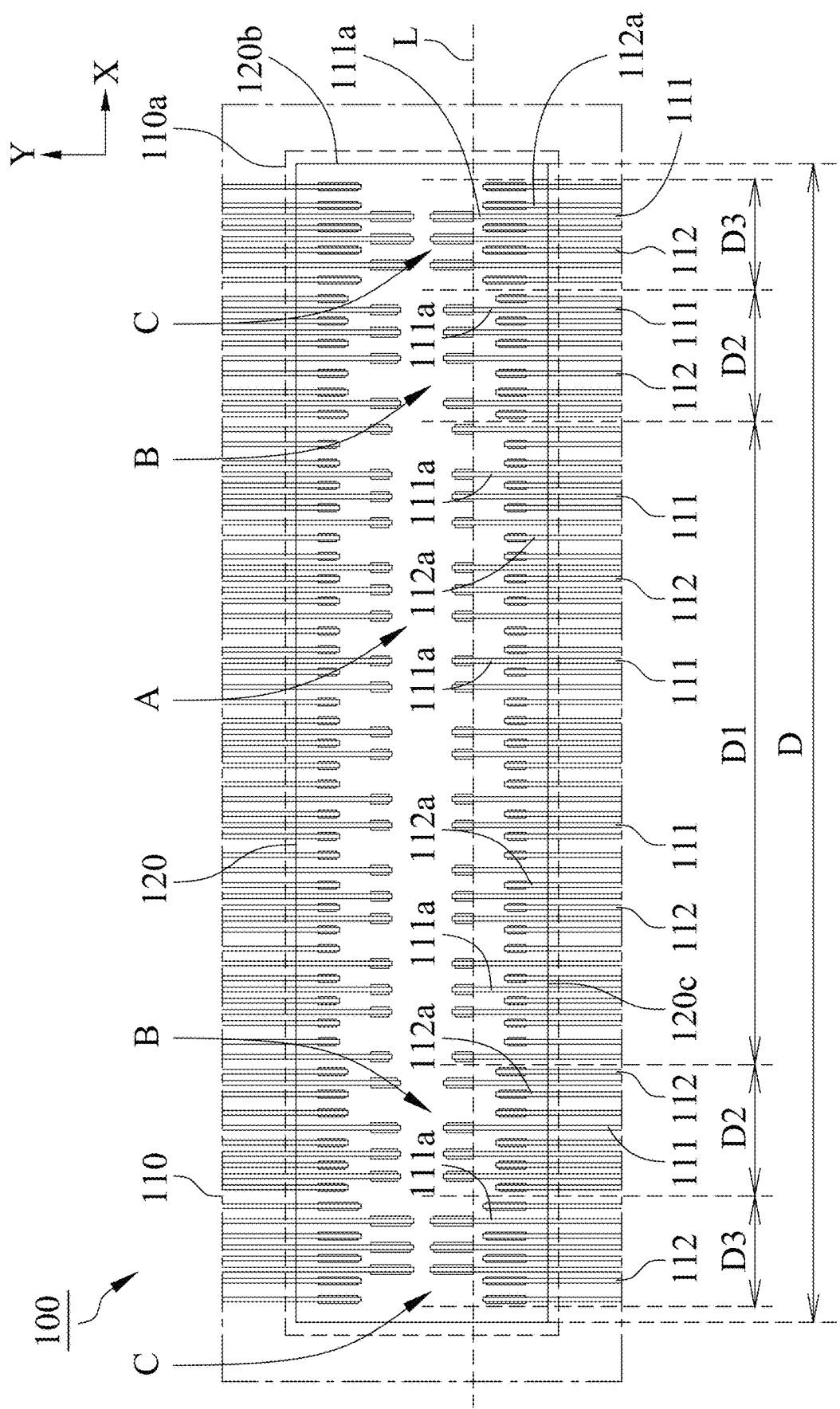
FIG. 1 is a top view diagram illustrating a semiconductor package in accordance with one embodiment of the present invention.
Figure 2:
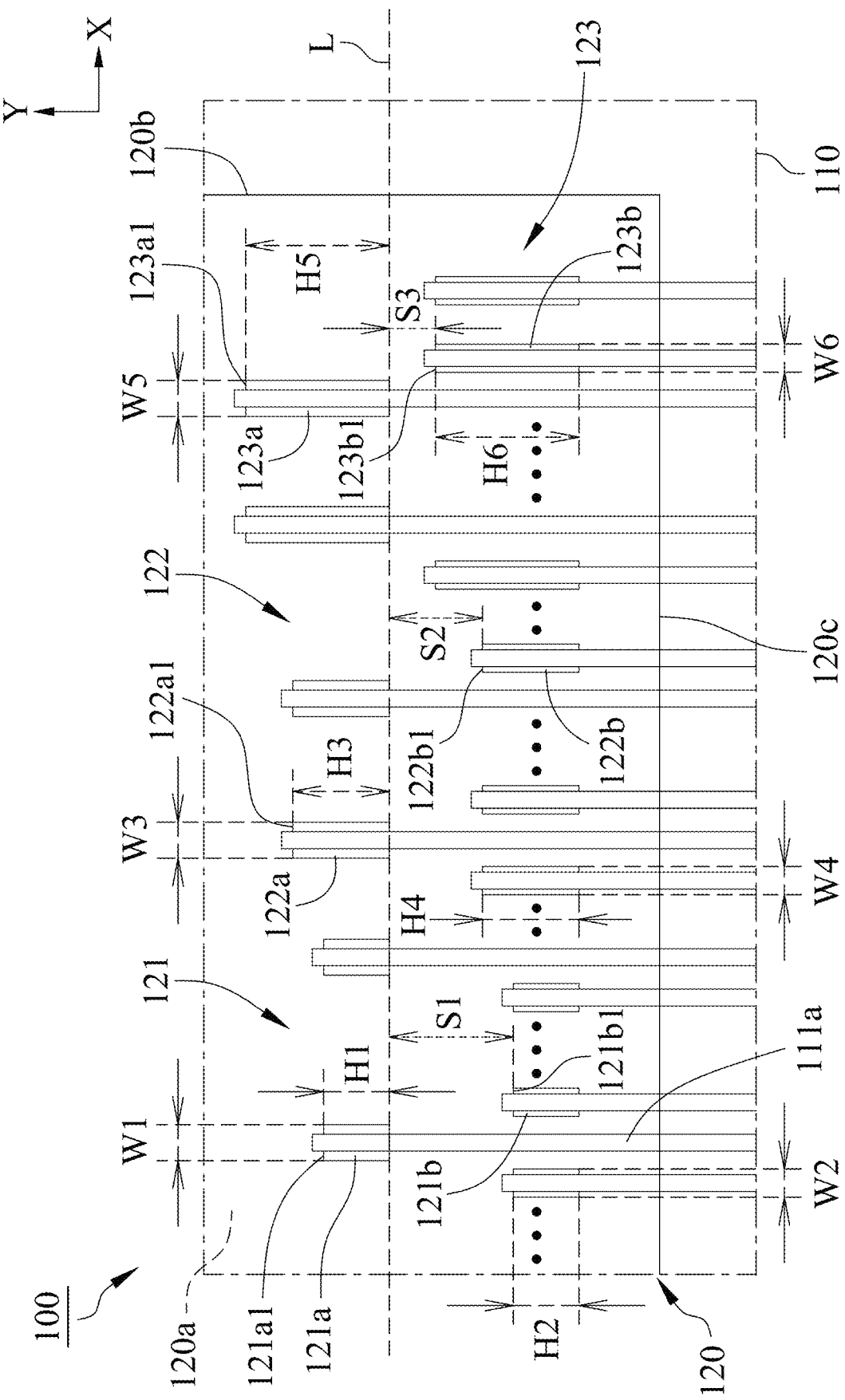
FIG. 2 is a partial enlarged view of FIG. 1.

With reference to FIGS. 1 and 2, a semiconductor package 100 in accordance with one embodiment of the present invention includes a flexible circuit board 110 and a chip 120. The flexible circuit board 110 includes first circuit lines 111 and second circuit lines 112, and there is at least one second circuit line 112 located between the two adjacent first circuit lines 111 in this embodiment. First leads 111a of the first circuit lines 111 and second leads 112a of the second circuit lines 112 are located on a chip-mounting area 110a defined on the flexible circuit board 110. The chip 120 is mounted on the chip-mounting area 110a and electrically connected to the flexible circuit board 110.

With reference to FIG. 2, the chip 120 includes a first bump group 121 and at least one second bump group 122. A first area A and at least one second area B are defined on a surface 120a of the chip 120, and the second area B is closer to a short side 120b of the surface 120a than the first area A in a first direction X. The chip 120 of this embodiment includes a first bump group 121 and two second bump groups 122, and the first bump group 121 is located between the two second bump groups 122 in the first direction X.

With reference to FIGS. 1 and 2, the first bump group 121 is disposed on the first area A and includes first inner bumps 121a and first outer bumps 121b, and the second bump group 122 is disposed on the second area B and includes second inner bumps 122a and second outer bumps 122b. Each of the first inner bumps 121a and the second inner bumps 122a are provided to be bonded to one of the first leads 111a, and each of the first outer bumps 121b and the second outer bumps 122b are provided to be bonded to one of the second leads 122a.

Referring to FIGS. 1 and 2, in a second direction Y which intersects the first direction X, the first outer bumps 121b are closer to a long side 120c of the surface 120a than the first inner bumps 121a, and the second outer bumps 122b are closer to the long side 120c than the second inner bumps 122a. And in the first direction X, the second inner bumps 122a are closer to the short side 120b than the first inner bumps 121a, and the second outer bumps 122b are closer to the short side 120b than the first outer bumps 121b. In this embodiment, the first direction X is horizontal, the second direction Y is vertical, and at least one of the first inner bumps 121a is passed through by an imaginary line L running in the first direction X. In the second direction Y, the distance from an inner end 121b1 of each of the first outer bumps 121b to the imaginary line L is defined as a first distance S1, and the distance from an inner end 122b1 of each of the second outer bumps 122b to the imaginary line L is defined as a second distance S2. The first distance S1 is preferably longer than the second distance S2.

As shown in FIGS. 1 and 2, in the second direction Y, a third length H3 of each of the second inner bumps 122a is greater than a first length H1 of each of the first inner bumps 121a, and a fourth length H4 of each of the second outer bumps 122b is greater than a second length H2 of each of the first outer bumps 121b. And in this embodiment, a first width W1 of each of the first inner bumps 121a is wider than a second width W2 of each of the first outer bumps 121b in the first direction X, and a third width W3 of each of the second inner bumps 122a is wider than a fourth width W4 of each of the second outer bumps 122b in the first direction X.

Figure 3:
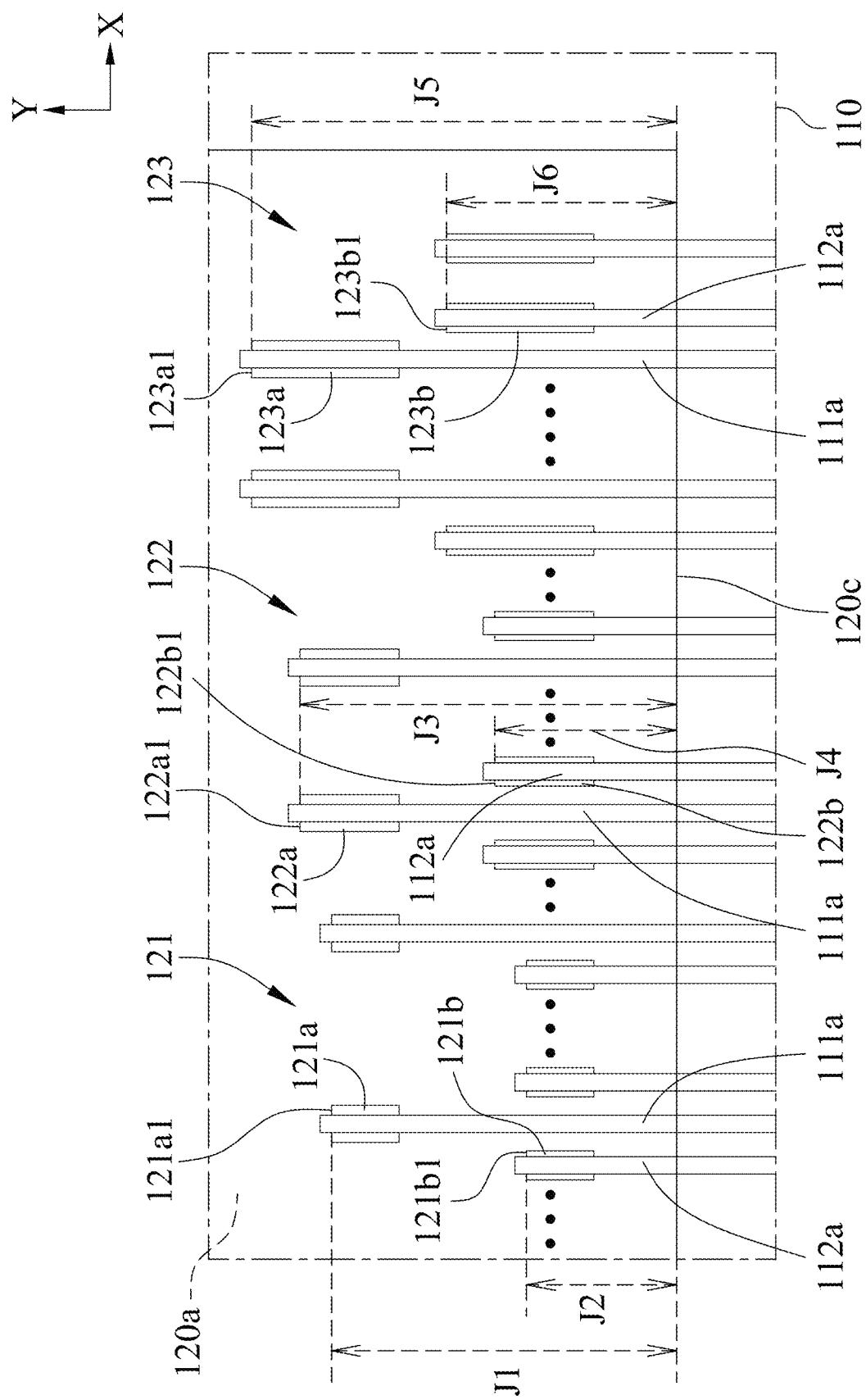
FIG. 3 is a partial enlarged view of FIG. 1.

With reference to FIGS. 2 and 3, along the second direction Y, each of the first leads 111a bonded to the first inner bump 121a has a first lead length J1, and each of the first leads 111a bonded to the second inner bump 122a has a third lead length J3. The distance from the long side 120c to an inner end 121a1 of the first inner bump 121a is defined as the first lead length J1, and the distance from the long side 120c to an inner end 122a1 of the second inner bump 122a is defined as the third lead length J3. Preferably, the third lead length J3 is greater than the first lead length J1.

Referring to FIGS. 2 and 3, in the second direction Y, each of the second leads 112a bonded to the first outer bump 121b has a second lead length J2, and each of the second leads 112a bonded to the second outer bump 122b has a fourth lead length J4. The distance from the long side 120c to the inner end 121b1 of the first outer bump 121b is defined as the second lead length J2, and the distance from the long side 120c to the inner end 122b1 of the second outer bump 122b is defined as the fourth lead length J4. Preferably, the fourth lead length J4 is greater than the second lead length J2.

With reference to FIGS. 1 and 2, owing to the second inner bumps 122a are longer than the first inner bumps 121a and the second outer bumps 122b are longer than the first outer bumps 121b, the bonding area between the second inner bumps 122a and the corresponding first leads 111a is larger than that between the first inner bumps 121a and the corresponding first leads 111a, and the bonding area between the second outer bumps 122b and the corresponding second leads 112a is larger than that between the first outer bumps 121b and the corresponding second leads 112a. As a result, the bonding strength of each of the second inner bumps 122a to the first lead 111a is greater than the bonding strength of each of the first inner bumps 121a to the first lead 111a, and the bonding strength of each of the second outer bumps 122b to the second lead 112a is greater than the bonding strength of each of the first outer bumps 121b to the second lead 112a. If distortion or warpage of the flexible circuit board 110 occurs due to process temperature variation, the bumps on the chip 120 with special arrangement can resist strain and stress generated by distortion or warpage of the flexible circuit board 110 such that it is possible to prevent the first leads 111a and/or the second leads 112a from being shifted and separated from the bumps, and also lower the possibility of lead bonding misalignment.

In this embodiment of the present invention as shown in FIGS. 1 and 2, the third length H3 of each of the second inner bumps 122a is not less than the second length H2 of each of the first outer bumps 121b. Preferably, the third length H3 is greater than the second length H2, and the bonding area between each of the second inner bumps 122a and the corresponding first lead 111a is greater than that between each of the first outer bumps 121b and the corresponding second lead 112a so as to obtain better bonding strength between the second inner bumps 122a and the first leads 111a. In addition, the fourth length H4 of each of the second outer bumps 122a is preferably greater than the first length H1 of each of the first inner bumps 121a. Thus, the bonding area between each of the second outer bumps 122b and the corresponding second lead 112a is greater than that between each of first inner bumps 121a and the corresponding first lead 111a, and the bonding strength between each of the second outer bumps 122b and the corresponding second leads 112 is better.

Referring to FIGS. 1 and 2, preferably, the chip 120 further includes a third bump group 123, and at least one third area C is defined on the surface 120a of the chip 120. In this embodiment, there are one first area A, two second areas B and two third areas C defined on the surface 120a, and along the first direction X, the first area A is located between the two second areas B, each of the second areas B is located between the first area A and one of the third areas C, and the third area C is closer to the short side 120b of the surface 120a than the second area B. The third bump group 123 is provided on the third area C so as to improve bonding strengths of the second bump group 122 and the third bump group 123 to the first leads 111a and the second leads 112a. Preferably, in the first direction X, a width D1 of the first area A accounts for 40-80% of an overall width D of the chip 120, a width D2 of each of the second areas B accounts for 5-15% of the overall width D of the chip 120, and a width D3 of each of the third areas C accounts for 5-15% of the overall width D of the chip 120.

As shown in FIGS. 1 and 2, the second bump group 122 is located between the first bump group 121 and the third bump group 123 in the first direction X. The third bump group 123 includes third inner bumps 123a and third outer bumps 123b, and the third outer bumps 123b are closer to the long side 120c than the third inner bumps 123a in the second direction Y. Along the first direction X, the second inner bumps 122a are located between the first inner bumps 121a and the third inner bumps 123a, the third inner bumps 123a are closer to the short side 120b than the second inner bumps 122a, the second outer bumps 122b are located between the first outer bumps 121b and the third outer bumps 123b, and the third outer bumps 123b are closer to the short side 120b than the second outer bumps 122b. Each of the third inner bumps 123a is provided to be bonded to one of the first leads 111a and each of the third outer bumps 123b is provided to be bonded to one of the second leads 112a. Along the second direction Y, the distance from an inner end 123b1 of each of the third outer bumps 123b to the imaginary line L is defined as a third distance S3, and in this embodiment, the second distance S2 from the inner end 122b1 of each of the second outer bumps 122b to the imaginary line L is greater than the third distance S3.

With reference to FIGS. 1 and 2, in the second direction Y, a fifth length H5 of each of the third inner bumps 123a is greater than the third length H3 of each of the second inner bumps 122a, and a sixth length H6 of each of the third outer bumps 123b is greater than the fourth length H4 of each of the second outer bumps 122b. And in this embodiment, a fifth width W5 of each of the third inner bumps 123a is greater than a sixth width W6 of each of the third outer bumps 123b in the first direction X.

With reference to FIGS. 2 and 3, in the second direction Y, each of the first leads 111a bonded to the third inner bump 123a has a fifth lead length J5, and each of the second leads 112a bonded to the third outer bump 123b has a sixth lead length J6. The fifth lead length J5 is the distance from the long side 120c to an inner end 123a1 of each of the third inner bumps 123a, and it is greater than the third lead length J3. The sixth lead length J6 is the distance from the long side 120c to the inner end 123b1 of each of the third outer bumps 123b and it is greater than the fourth lead length J4.

As shown in FIGS. 1 and 2, the third inner bumps 123a are designed to be longer than the second inner bumps 122a, and the third outer bumps 123b are designed to be longer than the second outer bumps 122b. For this reason, the bonding area between each of the third inner bumps 123a and the corresponding first lead 111a is larger than that between each of the second inner bumps 122a and the corresponding first lead 111a, and the bonding area between each of the third outer bumps 123b and the corresponding second lead 112a is larger than that between each of the second outer bumps 122b and the corresponding second lead 112a. Moreover, the bonding strength of the third inner bumps 123a to the first leads 111a is greater than the bonding strength of the second inner bumps 122a to the first leads 111a, and the bonding strength of the third outer bumps 123b to the second leads 112a is greater than the bonding strength of the second outer bumps 122b to the second leads 112a. Strain and stress induced by distortion or warpage of the flexible circuit board 110 can be inhibited to prevent the first leads 111a bonded to the third inner bumps 123a or the second leads 112a bonded to the third outer bumps 123b from being shifted and separated from the third inner bumps 123a or the third outer bumps 123b and prevent lead bonding misalignment.

As shown in FIGS. 1 and 2, preferably, the fifth length H5 of each of the third inner bumps 123a is not less than the fourth length H4 of each of the second outer bumps 122b. In this embodiment, the fifth length H5 is greater than the fourth length H4, and the bonding area between each of the third inner bumps 123a and the corresponding first lead 111a is larger than that between each of the second outer bumps 122b and the corresponding second lead 112a so as to increase the bonding strength of the third inner bumps 123a to the first leads 111a. Furthermore, the sixth length H6 of each of the third outer bumps 123b is greater than the third length H3 of each of the second inner bumps 122a, such that the bonding area between each of the third outer bumps 123b and the corresponding second lead 112a is larger than that between each of the second inner bumps 122a and the corresponding first lead 111a, and the bonding strength of the third outer bumps 123a to the second leads 112a is increased.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A semiconductor package comprising:
   a flexible circuit board including a plurality of first circuit lines and a plurality of second circuit lines, there is at least one of the plurality of second circuit lines located between the two adjacent first circuit lines, a plurality of first leads of the plurality of first circuit lines and a plurality of second leads of the plurality of second circuit lines are located on a chip-mounting area defined on the flexible circuit board; and
   a chip including a surface, a first bump group and at least one second bump group, a first area and at least one second area are defined on the surface in a first direction, the first bump group is disposed on the first area and includes a plurality of first inner bumps and a plurality of first outer bumps, the at least one second bump group is disposed on the at least one second area and includes a plurality of second inner bumps and a plurality of second outer bumps, the plurality of first outer bumps are closer to a long side of the surface than the plurality of first inner bumps in a second direction intersecting the first direction, the plurality of second outer bumps are closer to the long side than the plurality of second inner bumps in the second direction, a third length of each of the plurality of second inner bumps is greater than a first length of each of the plurality of first inner bumps in the second direction, a fourth length of each of the second outer bumps is greater than a second length of each of the plurality of first outer bumps in the second direction, each of the plurality of first and second inner bumps are bonded to one of the plurality of first leads, each of the plurality of first and second outer bumps are bonded to one of the plurality of second leads, a bonding area between each of the plurality of second inner bumps and one of the plurality of first leads is greater than that between each of the plurality of first inner bumps and one of the plurality of first leads, and a bonding area between each of the plurality of second outer bumps and one of the plurality of second leads is greater than that between each of the plurality of first outer bumps and one of the plurality of second leads.

2. The semiconductor package in accordance with claim 1, wherein the third length is greater than or equal to the second length, the fourth length is greater than the first length, and a bonding area between each of the plurality of second outer bumps and one of the plurality of second leads is greater than that between each of the plurality of first inner bumps and one of the plurality of first leads.

3. The semiconductor package in accordance with claim 2, wherein a bonding area between each of the plurality of second inner bumps and one of the plurality of first leads is greater than that between each of the plurality of first outer bumps and one of the plurality of second leads.

4. The semiconductor package in accordance with claim 1, wherein each of the plurality of first leads bonded to one of the plurality of first inner bumps has a first lead length which is defined from the long side to an inner end of the first inner bump in the second direction, each of the plurality of first leads bonded to one of the plurality of second inner bumps has a third lead length which is defined from the long side to an inner end of the second inner bump in the second direction, and the third lead length is greater than the first lead length.

5. The semiconductor package in accordance with claim 4, wherein each of the plurality of second leads bonded to one of the plurality of first outer bumps has a second lead length which is defined from the long side to an inner end of the first outer bump in the second direction, each of the plurality of second leads bonded to one of the plurality of second outer bumps has a fourth lead length which is defined from the long side to an inner end of the second outer bump in the second direction, and the fourth lead length is greater than the second lead length.

6. The semiconductor package in accordance with claim 1, wherein in the first direction, the at least one second area is closer to a short side of the surface than the first area, the plurality of second inner bumps are closer to the short side than the plurality of first inner bumps, and the plurality of second outer bumps are closer to the short side than the plurality of first outer bumps.

7. The semiconductor package in accordance with claim 1, wherein at least one of the plurality of first inner bumps is passed through by an imaginary line running in the first direction, a first distance defined from an inner end of each of the plurality of first outer bumps to the imaginary line is greater than a second distance defined from an inner end of each of the plurality of second outer bumps to the imaginary line in the second direction.

8. The semiconductor package in accordance with claim 5, wherein at least one third area is defined on the surface, the at least one second area is located between the first area and the at least one third area in the first direction, the chip further includes at least one third bump group which is disposed on the at least one third area, the at least one second bump group is located between the first bump group and the at least one third bump group in the first direction, the at least one third bump group includes a plurality of third inner bumps and a plurality of third outer bumps, the plurality of third outer bumps are closer to the long side than the plurality of third inner bumps in the second direction, the plurality of second inner bumps are located between the plurality of first and third inner bumps in the first direction, and the plurality of second outer bumps are located between the plurality of first and third outer bumps in the first direction, a fifth length of each of the plurality of third inner bumps is greater than the third length of each of the plurality of second inner bumps in the second direction, a sixth length of each of the plurality of third outer bumps is greater than the fourth length of each of the plurality of second outer bumps in the second direction, each of the plurality of third inner bumps is bonded to one of the plurality of first leads, each of the plurality of third outer bumps is bonded to one of the plurality of second leads, a bonding area between each of the plurality of third inner bumps and one of the plurality of first leads is greater than that between each of the plurality of second inner bumps and one of the plurality of first leads, and a bonding area between each of the plurality of third outer bumps and one of the plurality of second leads is greater than that between each of the plurality of second outer bumps and one of the plurality of second leads.

9. The semiconductor package in accordance with claim 8, wherein the fifth length is greater than or equal to the fourth length, the sixth length is greater than the third length, and a bonding area between each of the plurality of third outer bumps and one of the plurality of second leads is greater than that between each of the plurality of second inner bumps and one of the plurality of first leads.

10. The semiconductor package in accordance with claim 9, wherein a bonding area between each of the plurality of third inner bumps and one of the plurality of first leads is greater than that between each of the plurality of second outer bumps and one of the plurality of second leads.

11. The semiconductor package in accordance with claim 8, wherein each of the plurality of first leads bonded to one of the plurality of third inner bumps has a fifth lead length which is defined from the long side to an inner end of the third inner bump in the second direction, the fifth lead length is greater than the third lead length, each of the plurality of second leads bonded to one of the plurality of third outer bumps has a sixth lead length which is defined from the long side to an inner end of the third outer bump in the second direction, the sixth lead length is greater than the fourth lead length.

12. The semiconductor package in accordance with claim 8, wherein at least one of the plurality of first inner bumps is passed through by an imaginary line running in the first direction, a first distance defined from an inner end of each of the plurality of first outer bumps to the imaginary line is greater than a second distance defined from an inner end of each of the plurality of second outer bumps to the imaginary line in the second direction, and the second distance is greater than a third distance defined from an inner end of each of the plurality of third outer bumps to the imaginary line in the second direction.

13. The semiconductor package in accordance with claim 8, wherein in the first direction, a width of the first area accounts for 40-80% of an overall width of the chip, a width of the at least one second area accounts for 5-15% of the overall width of the chip, and a width of the at least one third area accounts for 5-15% of the overall width of the chip.

14. A chip comprising:
a surface, a first area and at least one second area are defined on the surface in a first direction;
a first bump group disposed on the first area and including a plurality of first inner bumps and a plurality of first outer bumps, the plurality of first outer bumps are closer to a long side of the surface than the plurality of first inner bumps in a second direction intersecting the first direction; and
at least one second bump group disposed on the at least one second area and including a plurality of second inner bumps and a plurality of second outer bumps, the plurality of second outer bumps are closer to the long side than the plurality of second inner bumps in the second direction, wherein a third length of each of the plurality of second inner bumps is greater than a first length of each of the plurality of first inner bumps in the second direction, and a fourth length of each of the plurality of second outer bumps is greater than a second length of each of the plurality of first outer bumps in the second direction.

15. The chip in accordance with claim 14, wherein the third length is greater than or equal to the second length, and the fourth length is greater than the first length.

16. The chip in accordance with claim 14, wherein a first width of each of the plurality of first inner bumps is greater than a second width of each of the plurality of first outer bumps in the first direction.

17. The chip in accordance with claim 14, wherein at least one of the plurality of first inner bumps is passed through by an imaginary line running in the first direction, a first distance defined from an inner end of each of the plurality of first outer bumps to the imaginary line is greater than a second distance defined from an inner end of each of the plurality of second outer bumps to the imaginary line in the second direction.

18. The chip in accordance with claim 14 further comprising at least one third bumps group, wherein at least one third area is defined on the surface, the at least one second area is located between the first area and the at least one third area in the first direction, the at least one third bump group is disposed on the at least one third area, the at least one second bump group is located between the first bump group and the at least one third bump group in the first direction, the at least one third bump group includes a plurality of third inner bumps and a plurality of third outer bumps, the plurality of third outer bumps are closer to the long side than the plurality of third inner bumps in the second direction, the plurality of second inner bumps are located between the plurality of first and third inner bumps in the first direction, the plurality of second outer bumps are located between the plurality of first and third outer bumps in the first direction, a fifth length of each of the plurality of third inner bumps is greater than the third length of each of the plurality of second inner bumps in the second direction, and a sixth length of each of the plurality of third outer bumps is greater than the fourth length of each of the plurality of second outer bumps in the second direction.

19. A chip comprising:
a surface, a first area and at least one second area are defined on the surface in a first direction;
a plurality of first bumps disposed on the first area; and
a plurality of second bumps disposed on the at least one second area, wherein a length of each of the plurality of second bumps is greater than a length of each of the plurality of first bumps in a second direction intersecting the first direction.

* * * * *